United States Patent
Takahashi et al.

(10) Patent No.: US 6,812,666 B2
(45) Date of Patent: Nov. 2, 2004

(54) CURRENT SENSE IC WITH CIRCUITRY FOR ELIMINATING RIPPLE CURRENT ERROR FROM MOTOR CURRENT MEASUREMENT

(75) Inventors: Toshio Takahashi, Rancho Palos Verdes, CA (US); Marijana Vukicevic, Los Angeles, CA (US)

(73) Assignee: International Rectifier Corporation, El Segundo, CA (US)

( * ) Notice: Subject to any disclaimer, the term of this patent is extended or adjusted under 35 U.S.C. 154(b) by 0 days.

(21) Appl. No.: 09/954,200

(22) Filed: Sep. 18, 2001

(65) Prior Publication Data

US 2002/0063546 A1 May 30, 2002

Related U.S. Application Data

(60) Provisional application No. 60/233,424, filed on Sep. 18, 2000, and provisional application No. 60/264,292, filed on Jan. 29, 2001.

(51) Int. Cl.[7] .............................................. G05B 11/28
(52) U.S. Cl. ...................................... 318/599; 318/606
(58) Field of Search ................................ 318/599–603, 318/606–608, 638, 650

(56) References Cited

U.S. PATENT DOCUMENTS

| | | | |
|---|---|---|---|
| 4,710,748 A | * 12/1987 | Champavier | ............... 341/122 |
| 5,613,149 A | 3/1997 | Afek et al. | |
| 5,723,963 A | * 3/1998 | Li et al. | ..................... 318/590 |
| 5,892,391 A | * 4/1999 | Hughes | ...................... 327/438 |
| 5,896,020 A | * 4/1999 | Pyo | ............................ 318/701 |
| 6,055,359 A | * 4/2000 | Gillett | ......................... 388/819 |
| 6,215,359 B1 | * 4/2001 | Peckham et al. | ........... 330/302 |
| 6,278,255 B1 | * 8/2001 | Yoo et al. | .................... 318/599 |

* cited by examiner

Primary Examiner—Marlon Fletcher
(74) Attorney, Agent, or Firm—Ostrolenk Faber Gerb & Soffen, LLP

(57) ABSTRACT

A circuit for recovering a current sense signal which is offset by a common mode displacement, such is the case when the signal is the voltage across a current sense resistor located on the high side bus or between the switches of a motor controller circuit. The circuit of the present invention converts the voltage across the resistor into a pulse code modulated (PWM) data, then downshifts the voltage, such that the signal of interest may be processed and recovered at the lower voltage for current feedback control purposes. The conversion of the measured current into a PWM signal is performed such that the PWM signal is synchronous with the motor PWM frequency. Although the output of the IC is synchronous with the motor PWM frequency, the output duty cycle is completely independent of the motor PWM duty cycle. In this way, the reconstructed sampled output of the IC is exactly equal to the fundamental motor current, without the effect of ripple current.

30 Claims, 4 Drawing Sheets

CURRENT SENSE IC WITH CIRCUITRY FOR ELIMINATING RIPPLE CURRENT ERROR FROM MOTOR CURRENT MEASUREMENT

This application claims the benefit of U.S. Provisional Application No. 60/233,424, filed Sep. 18, 2000 and U.S. Provisional Application No. 60/264,292, filed Jan. 29, 2001.

BACKGROUND OF THE INVENTION

1. Field of the Invention

The present invention relates to a current sense integrated circuit for motor current measurement, and, more specifically, to a current sense integrated circuit which eliminates ripple current error from the motor current measurement.

2. Description of the Related Art

Linear current sense integrated circuit chips, such as the IR2171, have been introduced in recent years for measuring motor current. The circuitry of the IR2171 current sense IC is disclosed and claimed in U.S. Pat. No. 6,215,435. As described in U.S. Pat. No. 6,215,435, the IR2171 linear current sense IC advantageously measures current flow at a high voltage potential, such as across a current sense resistor disposed in the path between the power switching node and the motor, and then level shifts the signal to a lower voltage potential for further processing, the output ultimately being used to close a current feedback loop to control the motor. As described in the '435 patent, the current sense signal at the high potential may be small as compared to the large common mode potential, making the current sense signal difficult to isolate.

The IR2171 linear current sense IC addresses this problem by providing a circuit which converts the high voltage current sense signal to a PWM signal, and then level shifts the PWM signal. To limit power consumption, the PWM signal at the high potential is converted into a current pulse train prior to level shifting to the low potential at which the current sense signal is recovered.

Regardless of whether the IR2171 IC or some other device is used to measure motor phase current, it is the fundamental frequency component of the PWM motor phase current that is desired, rather than the fundamental plus or minus the ripple current of motor current. The magnitude of the ripple current can be quite large compared to the fundamental motor current, particularly for low inductance motor types or for motors being driven at low PWM frequencies.

In most cases, the current feedback loop is closed in software, so a microcontroller or Digital Signal Processor (DSP) connected to the current sense IC periodically samples motor current. If motor current is sampled at a frequency that is not harmonically related to the PWM frequency, then aliasing errors will corrupt the measurements. The magnitude of the aliasing error will be equal to the ripple current magnitude. To reduce these errors, the software is usually written to sample the current synchronously with the PWM frequency of the motor current.

However, even if the sampling command could be perfectly timed to the PWM signal, errors still occur because of bandwidth limitations (phase delay) of conventional current measurement techniques. Moreover, sampling time is usually a compromise because of interrupts occurring to the software routine, and multiple current channels can not be simultaneously sampled in most microcontrollers or DSPs.

SUMMARY OF THE INVENTION

The present invention provides a circuit and method for current sensing, which has the ability to synchronize into the PWM motor carrier frequency and effectively remove ripple fluctuation of the motor current feedback signal due to the motor PWM switching.

The circuit of the present invention is preferably embodied in the form of an IC which measures the voltage across a shunt resistor in the motor phase current path. The IC converts the measured current into a PWM signal synchronous with the motor PWM frequency. Although the output of the IC is synchronous with the motor PWM frequency, the output duty cycle is completely independent of the motor PWM duty cycle: The output PWM duty cycle is exactly proportional to average motor current during that PWM period. In this way, the reconstructed sampled output of the IC is exactly equal to the fundamental motor current, without the effect of ripple current.

Other features and advantages of the present invention will become apparent from the following description of the invention which refers to the accompanying drawings.

DETAILED DESCRIPTION OF THE PREFERRED EMBODIMENT

Figure 1:
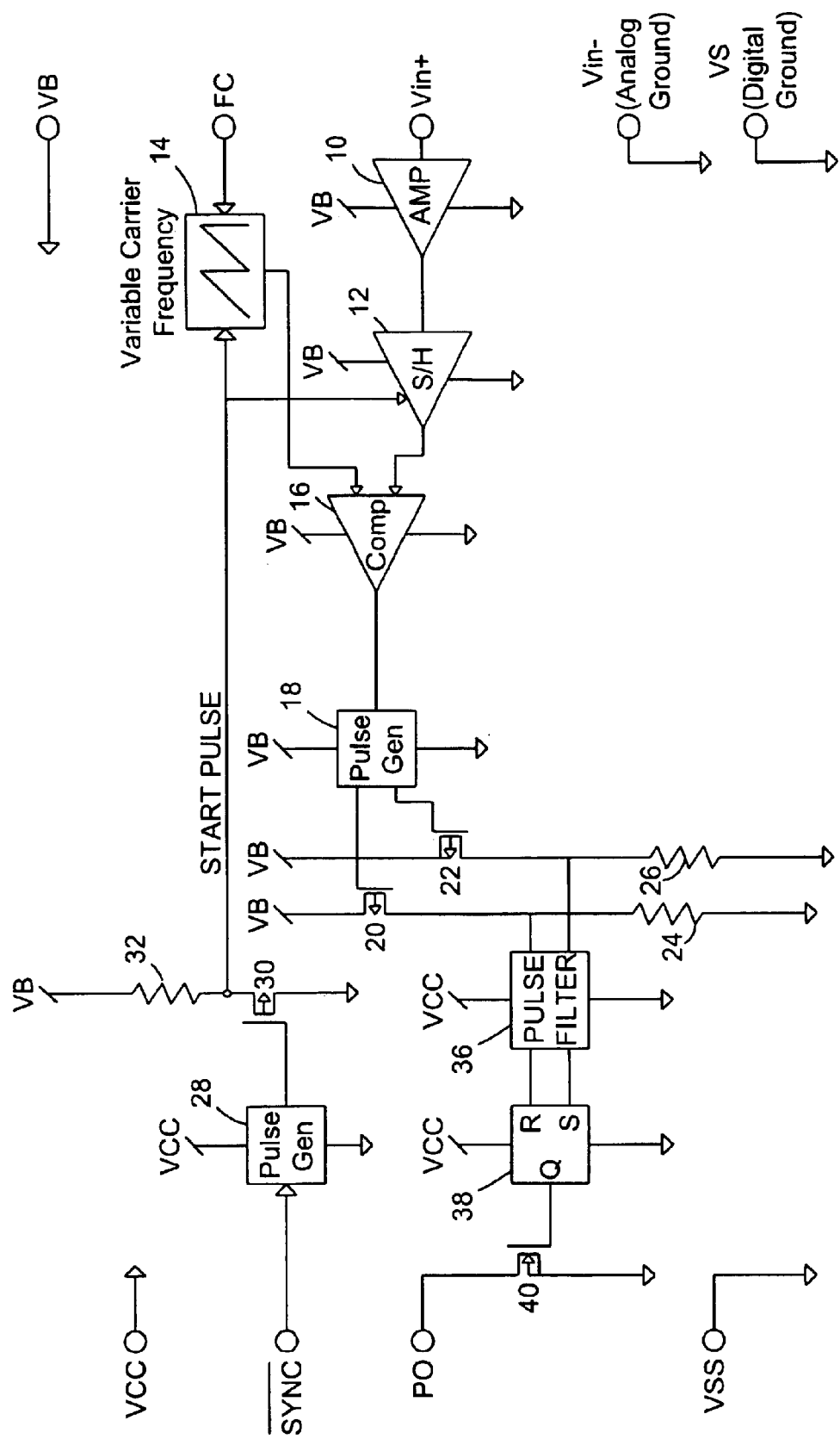
FIG. 1 is a block diagram of the novel current sensing IC of the present invention, which has the ability to synchronize into the PWM motor carrier frequency and effectively remove ripple fluctuation of the motor current feedback signal due to the motor PWM switching.

Referring now to FIG. 1, a block diagram of the circuit of the present invention is shown. The "Vin+" terminal on the right side of the block diagram may be connected to the high side of a resistor between the motor control circuit and the motor input, as shown in the connection diagram of FIG. 3. The input signal is first sent to a differential amplifier 10 for buffering and amplification as necessary. Other offset adjustments may be performed as necessary. To synchronize the processing of this signal with the PWM motor carrier frequency, the input signal is then sent to a sample and hold circuit 12 (described in further detail below), which is clocked by a signal from a SYNCH input.

The synchronized input signal is then translated from analog to digital form using pulse-width modulation encoding via a sawtooth generator 14 having a variable carrier frequency, the carrier frequency being synchronized, i.e., set, to the PWM motor carrier frequency via a connection to the SYNCH pin. In the preferred embodiment of the invention, sawtooth generator 14 outputs a high frequency (e.g., 40 kHz) waveform, which is fed to one input of a comparator 16, the other input being the synchronized output of sample and hold circuit 12. The output of comparator 16 is a pulse width modulated waveform, in which the width of the pulses represents the voltage Vin+.

The PWM output from comparator 16 is separated and fed into a pulse generator 18 with two outputs, one of which is rising edge triggered and the other is falling edge triggered.

After being converted to pulses in pulse generator 18, the digital PWM information is transposed to a lower reference potential. This is accomplished by using corresponding level shift FET transistors 20, 22 and resistors 24, 26. A single level shift circuit for synchronous transmission of PWM data may be appropriate in applications where the common mode potential is sufficiently low to tolerate power dissipation, further reducing cost. On the other hand, when two level shift circuits are used as depicted in FIG. 1, power dissipation is reduced, since only short duration conduction phases are needed to convey the necessary PWM edge events.

As shown in FIG. 1, a similar circuit and technique comprising a pulse generator 28 and level shift FET transistor 30 and resistor 32 is using to level-shift up the SYNCH signal (a 5V or 3.3V logic signal) to the high reference potential at which the sawtooth generator 14 and sample and hold circuit 12 are operating.

Recovery of the digital PWM data at the lower reference potential is accomplished using a DV/DT pulse filter 36 and an R-S latch circuit 38, as shown in FIG. 1. The result is a PWM signal at the lower voltage potential representing the input voltage Vin+. This signal is buffered by an FET transistor 40 and sent to output pin PO, which can be connected to the input of a microcontroller or DSP (not shown) to complete a feedback loop for motor control.

Figure 2:
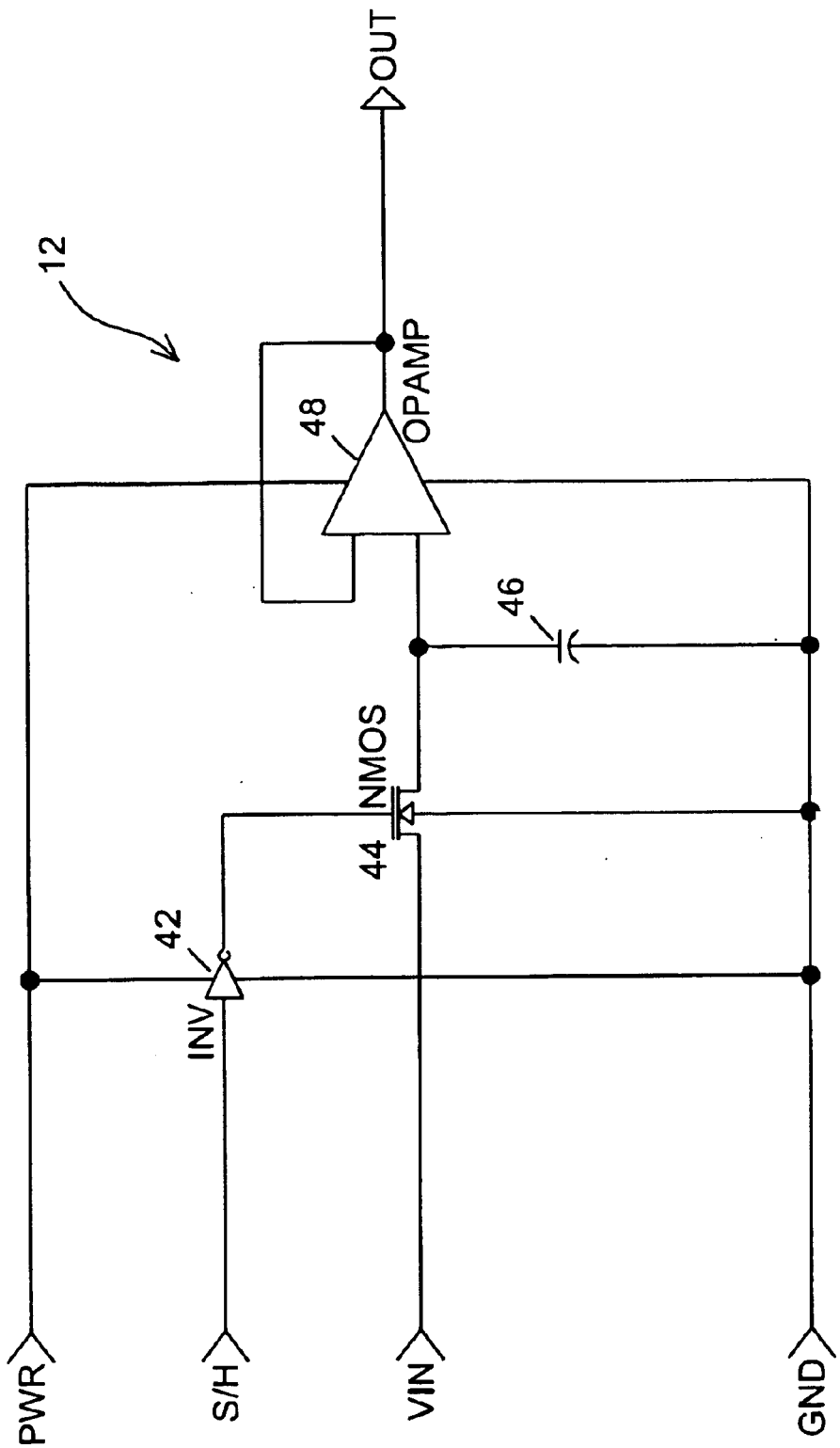
FIG. 2 is a circuit schematic of the sample and hold component in the circuit of FIG. 1.

FIG. 2 shows the detailed circuitry of sample and hold circuit 12. Sampling of the input signal occurs when the level-shift S/H signal (clocked by the signal applied to the $\overline{\text{SYNCH}}$ pin) is low. The low S/H signal is inverted to a high signal by inverter 42, which turns an NMOS transistor 44 on, such that the voltage on a capacitor 46 tracks Vin+. An op amp 48 is provided for buffering, as in the IR2171 IC, in the same manner as described in U.S. Pat. No. 6,215,435. Sample and hold circuit 12 switches to the "hold" mode when S/H signal goes high. This high signal is inverted to a low signal by inverter 42, turning off NMOS transistor 44. The voltage on capacitor 46 is the Vin+ voltage that was transferred to the capacitor at the moment just prior to the S/H signal going high. That voltage is held until the S/H signal becomes low, and the sampling routine is repeated.

Figure 3:
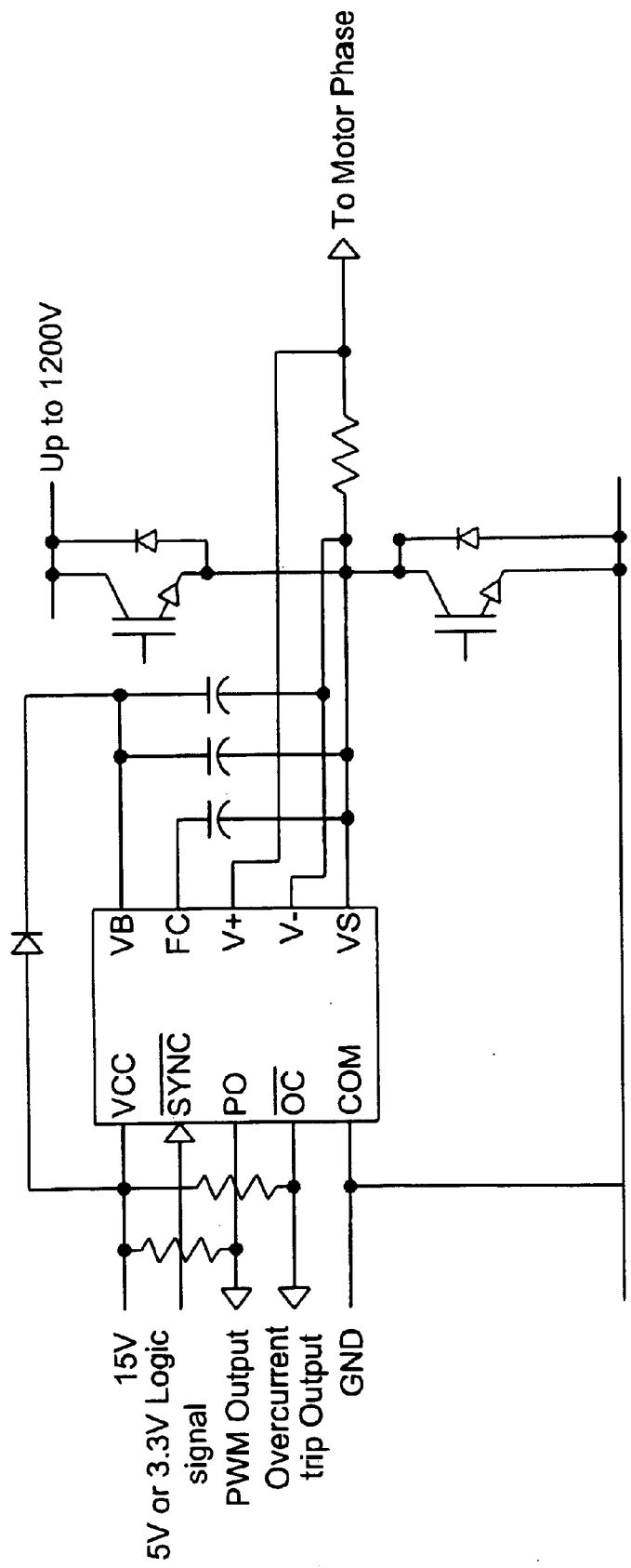
FIG. 3 is a circuit diagram showing the connection of the novel HVIC of the present invention to a sense resistor in a motor controller circuit.
Figure 4:
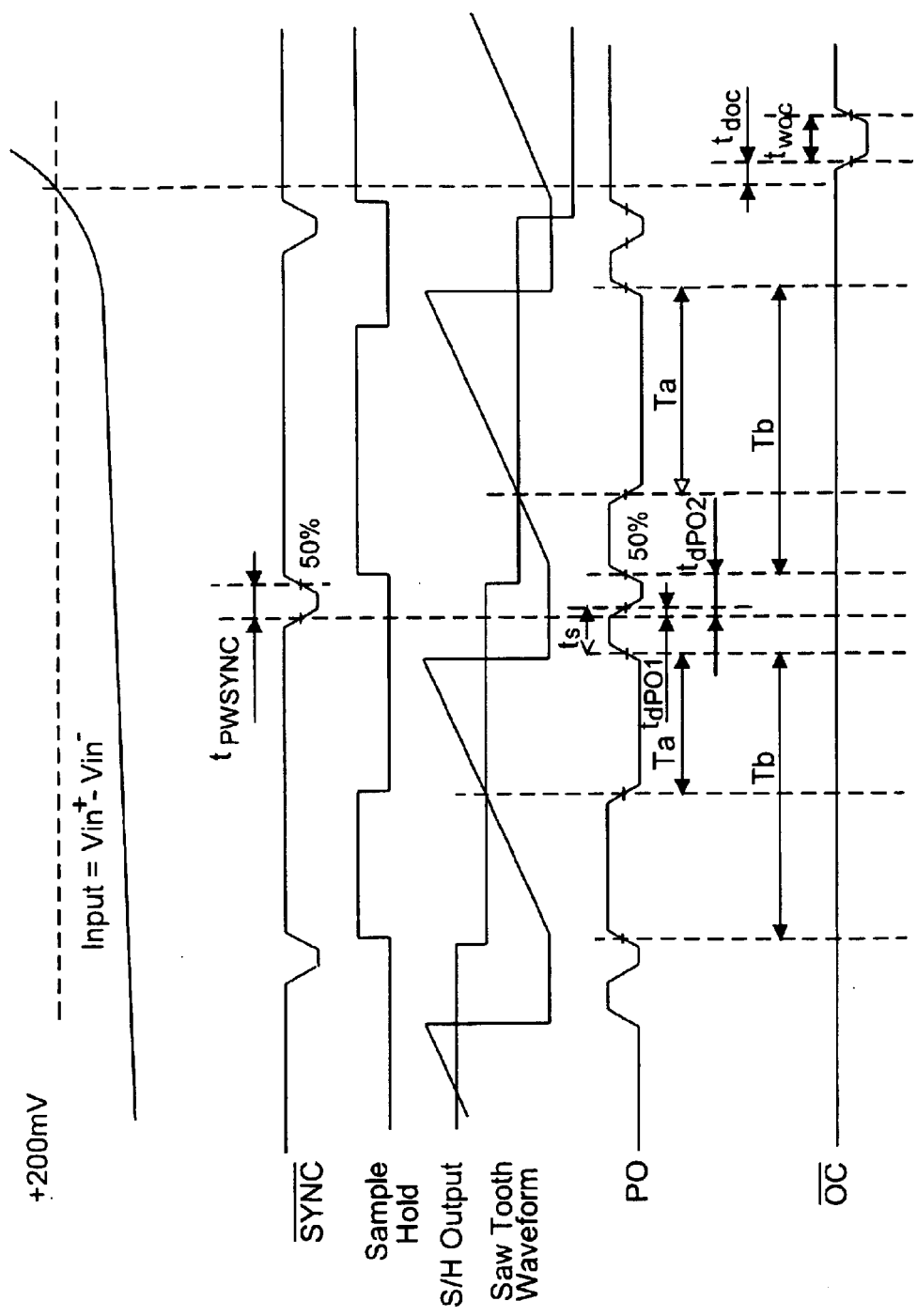
FIG. 4 is a timing diagram of the operation of the novel HVIC of the present invention.

In the preferred embodiment of the invention, all of the functional construction blocks described above are integrated onto a single, monolithic chip to provide a linear current sensing IC for motor drive applications, as shown in the block diagram of FIG. 3. The output format of the IC shown in FIG. 3 is discrete PWM signal at output pin PO, which eliminates the need for an AID interface. A timing diagram for the circuit of the present invention is shown in FIG. 4. The pin-outs for the ten-pin linear current sensing IC shown in FIG. 3 are as follows:

| | |
|---|---|
| VCC | Low side and logic supply voltage |
| COM | Low side logic ground |
| V+ | Positive sense input |
| V- | Negative sense input |
| VB | High side supply |
| VS | High side return |
| FC | Capacitor |
| PO | Digital PWM output |
| $\overline{\text{SYNCH}}$ | Synch input |
| $\overline{\text{OC}}$ | Overcurrent trip output |

As shown in the timing diagram of FIG. 4, the current sense IC of the present invention provides a low output on the $\overline{\text{OC}}$ pin indicating an overcurrent condition if the current sense input Vin+ exceeds a predetermined value for time $t_{dOC}$.

Although the present invention has been described in relation to particular embodiments thereof, many other variations and modifications and other uses will become apparent to those skilled in the art. It is preferred, therefore, that the present invention be limited not by the specific disclosure herein.

What is claimed is:

1. A circuit for recovering an input signal having a PWM frequency and having a first potential which is offset by a common mode displacement from a second potential, comprising:

circuitry for converting the input signal at said first potential to a pulse width modulated signal; and two level shifting circuits for level shifting rising edges and falling edges, respectively, of said pulse width modulated signal from said first potential to said second potential;

wherein the circuit outputs a level shifted PWM signal which is synchronized to the PWM frequency of the input signal to effectively remove ripple fluctuation in the output signal, circuitry for converting said pulse width modulated signal at said first potential into a pair of current pulse trains triggered by rising edges and falling edges, respectively, of said PWM signal prior to level shifting from said first potential to said second potential; and circuitry for converting said level shifted pulse train signals into a pulse width modulated signal at said second potential, wherein said circuitry for converting the input signal at said first potential to a pulse width modulated signal comprises an AID converter using pulse width modulated encoding comprising a waveform generator for generating a triangular or sawtooth signal synchronized to the PWM frequency of the input signal, a sample and hold circuit synchronized to the PWM frequency of the input signal, and a comparator for determining whether said input signal is greater than or less than said triangular or sawtooth signal.

2. A circuit as recited in claim 1, wherein said circuitry for converting said level shifted pulse train signal into a pulse width modulated signal at said second potential comprises a pulse filter and an R-S latch.

3. A circuit as recited in claim 1, wherein said input signal comprises the voltage across a current sense resistor in a motor controller circuit.

4. A circuit as recited in claim 3, wherein the duty cycle of the output PWM signal is proportional to average motor current.

5. The circuit of claim 1, wherein said input signal is indicative of a motor current, and wherein the duty cycle of the output PWM signal is proportional to average motor current.

6. A method for recovering an input signal having a PWM frequency and being at a first potential which is offset by a common mode displacement from a second potential, comprising the steps of:

converting the input signal at said first potential to a pulse width modulated signal, said pulse width modulated signal being synchronized to the PWM frequency of the input signal; and separately level shifting rising edges and falling edges of said pulse width modulated signal from said first potential to said second potential, wherein:

said step of converting the input signal at said first potential to a pulse width modulated signal is performed by an A/D conversion using a pulse width modulated encoding technique comprising generating a triangular or sawtooth signal at a carrier frequency synchronized to the PWM frequency of the input signal, sampling and holding the input signal in a manner synchronized to the PWM frequency of the input signal and determining whether said input signal is greater than or less than said triangular or sawtooth signal.

7. A method as recited in claim 6, wherein said step of converting said level shifted pulse train signal into said pulse width modulated signal at said second potential is performed using a pulse filter and an R-S latch.

8. A method as recited in claim 6, wherein said input signal comprises the voltage across a current sense resistor in a motor controller circuit.

9. A method as recited in claim 8, wherein the duty cycle of the output PWM signal is proportional to average motor current.

10. A method as recited in claim 6, wherein said input is indicative of a motor current, wherein the duty cycle of the output PWM signal is proportional to average motor current.

11. A method as recited in claim 6, wherein the input signal is indicative of a motor current; the waveform generator has a variable carrier frequency which is synchronized to said input signal by an input SYNC signal which is synchronized with a PWM motor carrier frequency; and wherein said sample and hold circuit is synchronized to said input signal by an input SYNC signal which is synchronized with the PWM motor carrier frequency.

12. A circuit for recovering an input signal having a PWM frequency and having a first potential which is offset by a common mode displacement from a second potential, comprising:

circuitry for converting the input signal at said first potential to a pulse width modulated signal; and two level shifting circuits for level shifting rising edges and falling edges, respectively, of said pulse width modulated signal from said first potential to said second potential;

wherein the circuit outputs a level shifted PWM signal which is synchronized to the PWM frequency of the input signal to effectively remove ripple fluctuation in the output signal, wherein:

said circuitry for converting the input signal at said first potential to a pulse width modulated signal comprises an A/D converter using pulse width modulated encoding comprising a waveform generator for generating a triangular or sawtooth signal synchronized to the PWM frequency of the input signal, a sample and hold circuit synchronized to the PWM frequency of the input signal, and a comparator for determining whether said input signal is greater than or less than said triangular or sawtooth signal.

13. A circuit as recited in claim 12, wherein said circuitry for converting said level shifted pulse train signal into a pulse width modulated signal at said second potential comprises a pulse filter and an R-S latch.

14. A circuit as recited in claim 12, wherein the input signal is indicative of a motor current; the waveform generator has a variable carrier frequency which is synchronized to said input signal by an input SYNC signal which is synchronized with a PWM motor carrier frequency; and wherein said sample and hold circuit is synchronized to said input signal by an input SYNC signal which is synchronized with the PWM motor carrier frequency.

15. A method for recovering an input signal having a PWM frequency and being at a first potential which is offset by a common mode displacement from a second potential, comprising the steps of:

converting the input signal at said first potential to a pulse width modulated signal, said pulse width modulated signal being synchronized to the PWM frequency of the input signal; and separately level shifting rising edges and falling edges of said pulse width modulated signal from said first potential to said second potential, converting said pulse width modulated signal at said first potential into a pair of current pulse trains triggered by rising and falling edges, respectively, of said PWM signal prior to level shifting from said first potential to said second potential; and converting said level shifted pulse train signals into a pulse width modulated signal at said second potential, wherein:

said step of converting the input signal at said first potential to a pulse width modulated signal is performed by an A/D conversion using a pulse width modulated encoding technique comprising generating a triangular or sawtooth signal at a carrier frequency synchronized to the PWM frequency of the input signal, sampling and holding the input signal in a manner synchronized to the PWM frequency of the input signal and determining whether said input signal is greater than or less than said triangular or sawtooth signal.

16. A method as recited in claim 15, wherein said step of converting said level shifted pulse train signal into said pulse width modulated signal at said second potential is performed using a pulse filter and an R-S latch.

17. A circuit for recovering an input signal having a PWM frequency and having a first potential which is offset by a common mode displacement from a second potential, comprising:

circuitry for converting the input signal at said first potential to a pulse width modulated signal; and circuitry for level shifting said pulse width modulated signal from said first potential to said second potential;

wherein the circuit outputs a level shifted PWM signal which is synchronized to the PWM frequency of the input signal to effectively remove ripple fluctuation in the output signal, wherein:

said circuitry for converting the input signal at said first potential to a pulse width modulated signal comprises an A/D converter using pulse width modulated encoding comprising a waveform generator for generating a triangular or sawtooth signal synchronized to the PWM frequency of the input signal, a sample and hold circuit synchronized to the PWM frequency of the input signal, a sample and hold circuit synchronized to the PWM frequency of the input signal, and a comparator for determining whether said input signal is greater than or less than said triangular or sawtooth signal.

18. A circuit as recited in claim 17, wherein:

said circuitry for converting said level shifted pulse train signal into a pulse width modulated signal at said second potential comprises a pulse filter and an R-S latch.

19. A circuit as recited in any one of claims 17 and 18, further comprising:

circuitry for converting said pulse width modulated signal at said first potential into a current pulse train prior to level shifting from said first potential to said second potential; and circuitry for converting said level shifted pulse train signal into a pulse width modulated signal at said second potential.

20. A circuit as recited in claim 17, wherein said input signal is indicative of a motor current, and wherein the duty cycle of the output PWM signal is proportional to average motor current.

21. A circuit as recited in claim 17, wherein the input signal is indicative of a motor current; the waveform generator has a variable carrier frequency which is synchronized to said input signal by an input SYNC signal which is synchronized with a PWM motor carrier frequency; and wherein said sample and hold circuit is synchronized to said input signal by an input SYNC signal which is synchronized with the PWM motor carrier frequency.

22. A method for recovering an input signal having a PWM frequency and being at a first potential which is offset by a common mode displacement from a second potential, comprising the steps of:
   converting the input signal at said first potential to a pulse width modulated signal, said pulse width modulated signal being synchronized to the PWM frequency of the input signal; and
   level shifting said pulse width modulated signal from said first potential to said second potential, wherein:
   said step of converting the input signal at said first potential to a pulse width modulated signal is performed by an A/D conversion using a pulse width modulated encoding technique comprising generating a triangular or sawtooth signal at a carrier frequency synchronized to the PWM frequency of the input signal, sampling and holding the input signal in a manner synchronized to the PWM frequency of the input and determining whether said input signal is greater than or less than said triangular or sawtooth signal.

23. A method as recited in claim 22, wherein said step of converting said level shifted pulse train signal into said pulse width modulated signal at said second potential is performed using a pulse filter and an R-S latch.

24. A method as recited in any one of claims 22 and 23, further comprising the steps of:
   converting said pulse width modulated signal at said first potential into a current pulse train prior to level shifting from said first potential to said second potential; and
   converting said level shifted pulse train signal into a pulse width modulated signal at said second potential.

25. A method as recited in claim 22, wherein said input signal is indicative of a motor current, and wherein the duty cycle of the output PWM signal is proportional to average motor current.

26. A method as recited in claim 22, wherein the input signal is indicative of a motor current; the waveform generator has a variable carrier frequency which is synchronized to said input signal by an input SYNC signal which is synchronized with a PWM motor carrier frequency;and wherein said sample and hold circuit is synchronized to said input signal by an input SYNC signal which is synchronized with the PWM motor carrier frequency.

27. A circuit for recovering an input signal having a PWM frequency and having a first potential which is offset by a common mode displacement from a second potential, comprising:
   circuitry for converting the input signal at said first potential to a pulse width modulated signal; and
   two level shifting circuits for level shifting rising edges and falling edges, respectively, of said pulse width modulated signal from said first potential to said second potential;
   wherein the circuit outputs a level shifted PWM signal which is synchronized to the PWM frequency of the input signal to effectively remove ripple fluctuation in the output signal,
   wherein the input signal having a PWM frequency is indicative of a motor current, and the output PWM signal is synchronized to said PWM frequency by an input SYNC signal that is synchronized with a PWM motor carrier frequency.

28. A method for recovering an input signal having a PWM frequency and being at a first potential which is offset by a common mode displacement from a second potential, comprising the steps of:
   converting the input signal at said first potential to a pulse width modulated signal, said pulse width modulated signal being synchronized to the PWM frequency of the input signal; and
   separately level shifting rising edges and falling edges of said pulse width modulated signal from said first potential to said second potential,
   wherein the input signal having a PWM frequency is indicative of a motor current, and the output PWM signal is synchronized to said PWM frequency by an input SYNC signal that is synchronized with a PWM motor carrier frequency.

29. A circuit for recovering an input signal having a PWM frequency and having a first potential which is offset by a common mode displacement from a second potential, comprising:
   circuitry for converting the input signal at said first potential to a pulse width modulated signal; and
   circuitry for level shifting said pulse width modulated signal from said first potential to said second potential;
   wherein the circuit outputs a level shifted PWM signal which is synchronized to the PWM frequency of the input signal to effectively remove ripple fluctuation in the output signal,
   wherein the input signal having a PWM frequency is indicative of a motor current, and the output PWM signal is synchronized to said PWM frequency by an input SYNC signal that is synchronized with a PWM motor carrier frequency.

30. A method for recovering an input signal having a PWM frequency and being at a first potential which is offset by a common mode displacement from a second potential, comprising the steps of:
   converting the input signal at said first potential to a pulse width modulated signal, said pulse width modulated signal being synchronized to the PWM frequency of the input signal; and
   level shifting said pulse width modulated signal from said first potential to said second potential,
   wherein the input signal having a PWM frequency is indicative of a motor current, and the output PWM signal is synchronized to said PWM frequency by an input SYNC signal that is synchronized with a PWM motor carrier frequency.

* * * * *